United States Patent
Ieda et al.

(10) Patent No.: US 7,132,768 B2
(45) Date of Patent: Nov. 7, 2006

(54) HUMAN BODY DETECTING DEVICE

(75) Inventors: Kiyokazu Ieda, Chiryu (JP); Yuichi Murakami, Chiryu (JP); Eiji Mushiake, Chita-gun (JP)

(73) Assignee: Aisin Seiki Kabushiki Kaisha, Kariya (JP)

( * ) Notice: Subject to any disclaimer, the term of this patent is extended or adjusted under 35 U.S.C. 154(b) by 406 days.

(21) Appl. No.: 10/327,090

(22) Filed: Dec. 24, 2002

(65) Prior Publication Data

US 2003/0128116 A1    Jul. 10, 2003

(30) Foreign Application Priority Data

Dec. 26, 2001   (JP) .............................. 2001-394461

(51) Int. Cl.
*G08B 13/08*    (2006.01)
*G08B 13/26*    (2006.01)

(52) U.S. Cl. ............... 307/652; 340/545.4; 340/545.7; 340/545.8; 340/561; 340/563

(58) Field of Classification Search ............... 307/652; 340/545.4, 545.7, 545.8, 561, 563
See application file for complete search history.

(56) References Cited

U.S. PATENT DOCUMENTS

| | | |
|---|---|---|
| 5,134,392 A | 7/1992 | Takeuchi et al. |
| 5,948,031 A | 9/1999 | Jirno et al. .................... 701/45 |
| 6,161,070 A | 12/2000 | Jirno et al. .................... 701/45 |
| 6,208,249 B1 | 3/2001 | Saito et al. .................. 340/561 |
| 6,577,228 B1 | 6/2003 | Tsuchida et al. ........... 340/5.72 |
| 2003/0101781 A1* | 6/2003 | Budzynski et al. ........... 70/239 |

FOREIGN PATENT DOCUMENTS

| | | |
|---|---|---|
| EP | 0 796 965 A | 9/1997 |
| EP | 0 884 796 A | 12/1998 |
| EP | 0 943 764 A | 9/1999 |
| EP | 1 235 190 A | 8/2002 |
| JP | 42-12362 | 7/1967 |
| JP | 61-2089 A | 1/1984 |
| JP | 10-308149 A | 11/1998 |
| JP | 11-78655 A | 3/1999 |
| JP | 2000-160897 A | 6/2000 |
| JP | 2001-55852 A | 2/2001 |
| JP | 2001-257526 A | 9/2001 |
| WO | WO 01/40606 A | 6/2001 |
| WO | WO 02/21455 A | 3/2002 |

OTHER PUBLICATIONS

Office Action and partial English language translation.

* cited by examiner

*Primary Examiner*—Robert L. Deberadinis
*Assistant Examiner*—Hal I. Kaplan
(74) *Attorney, Agent, or Firm*—Buchanan Ingersoll & Rooney PC

(57) ABSTRACT

A human body detecting device for detecting an approach of a human body includes a sensor electrode provided in a housing and having detecting portions for detecting the approach of the human body to the housing. Each of the detecting portions is provided at a respective surface side in the housing.

11 Claims, 4 Drawing Sheets

HUMAN BODY DETECTING DEVICE

This application is based on and claims priority under 35 U.S.C. § 119 with respect to Japanese Application No. 2001-394461 filed on Dec. 26, 2001, the entire content of which is incorporated herein by reference.

FIELD OF THE INVENTION

This invention generally relates to a human body detecting device. More particularly, this invention pertains to a human body detecting device for detecting an approach of a human body to a door handle.

BACKGROUND OF THE INVENTION

A known human body detecting sensor for a vehicle including a parallel cable as a non-contact sensor, which detects an approach of a user in a non-contacting manner, is disclosed in Japanese Patent Laid-Open Publication No. H10-308149. The parallel cable is accommodated in a hollow portion formed inside of a door handle for opening and closing a vehicle door. According to the disclosed human body detecting device for a vehicle, when the approach of a registered user to the vehicle door is recognized, first a control signal is transmitted to just allow a release of a door lock. Next, when the human body detecting sensor detects that the door handle is gripped to be opened, the door lock is then actually released.

When a user operates the door handle, his hand normally contacts with a front or back surface of the door handle. The disclosed human body detecting sensor is provided in the middle position of the door handle, i.e., provided rather far from both the front and the back surfaces of the door handle. Thus the effect of detecting the human body may not be always sufficient on both the front and the back surfaces of the door handle.

Recently, vehicles have been provided with an antenna for communicating with the outside of the vehicle. The antenna is provided in a space inside of the door handle and therefore, the human body detecting sensor is such that the antenna should be accommodated in a limited space in the door handle. In this case, only one sensor for detecting the human body is used and is provided in the vicinity of either the front surface or the back surface of the door handle. The human body detecting element cannot be provided in the vicinity of both surfaces of the door, handle so that only one surface can provide a preferred sensitivity to detect the human body.

For purposes of design or texture, an ornamental plating may be applied on resin or the door handle may be made of a metal. In this case, however, the known human body detecting sensor cannot provide a sufficient detecting function or cannot detect the human body appropriately.

Thus, a need exists for the human body detecting device which addresses at least the foregoing drawback associated with other known human body detecting devices.

SUMMARY OF THE INVENTION

It is an object of the present invention to provide a human body detecting device having a high sensitivity for detecting an approach of a human body by using multiple different surfaces of a housing.

According to an aspect of the present invention, a human body detecting device includes a sensor electrode provided in a housing and has detecting portions for detecting an approach of a human body to the housing. The detecting portions of the sensor electrode detect an approach of a human body to the door, and each of the detecting portions is provided at each surface side in the housing.

The sensor electrode is bent in a U-shape to form an outwardly extending portion on one side wall of the sensor electrode and an inwardly extending portion on the other side wall of the sensor electrode. The outwardly extending portion on the one side wall of the sensor electrode is provided at one surface side in the housing as one of the detecting portions and the inwardly extending portion on the other side wall of the sensor electrode is provided at the other surface side in the housing as the other one of the detecting portions.

The housing is represented by a door handle for a vehicle forming a hollow portion therein, in which the detecting portions are housed at a vehicle-door side and at an opposite side to the vehicle door respectively. The detecting portion on the opposite side to the vehicle door is provided with a space for radio wave transmission and a transmitting antenna is provided in a space between the detecting portions.

The sensor electrode is branched from a base portion thereof into a first electrode piece and a second electrode piece. The first electrode piece and the second electrode piece are bent in the same U-shape direction whereby the outwardly extending portion and the inwardly extending portion are formed respectively as the detecting portions of the first electrode piece and the second electrode piece.

The sensor electrode may have a rectangular tube shape, and a space for radio wave transmission is formed on a surface provided at the opposite side to the vehicle door of the sensor electrode.

BRIEF DESCRIPTION OF THE DRAWING FIGURES

The foregoing and additional features and characteristics of the present invention will become more apparent from the following detailed description considered with reference to the accompanying drawing figures in which like reference numerals designate like elements and wherein.

DETAILED DESCRIPTION OF THE INVENTION

Figure 1:
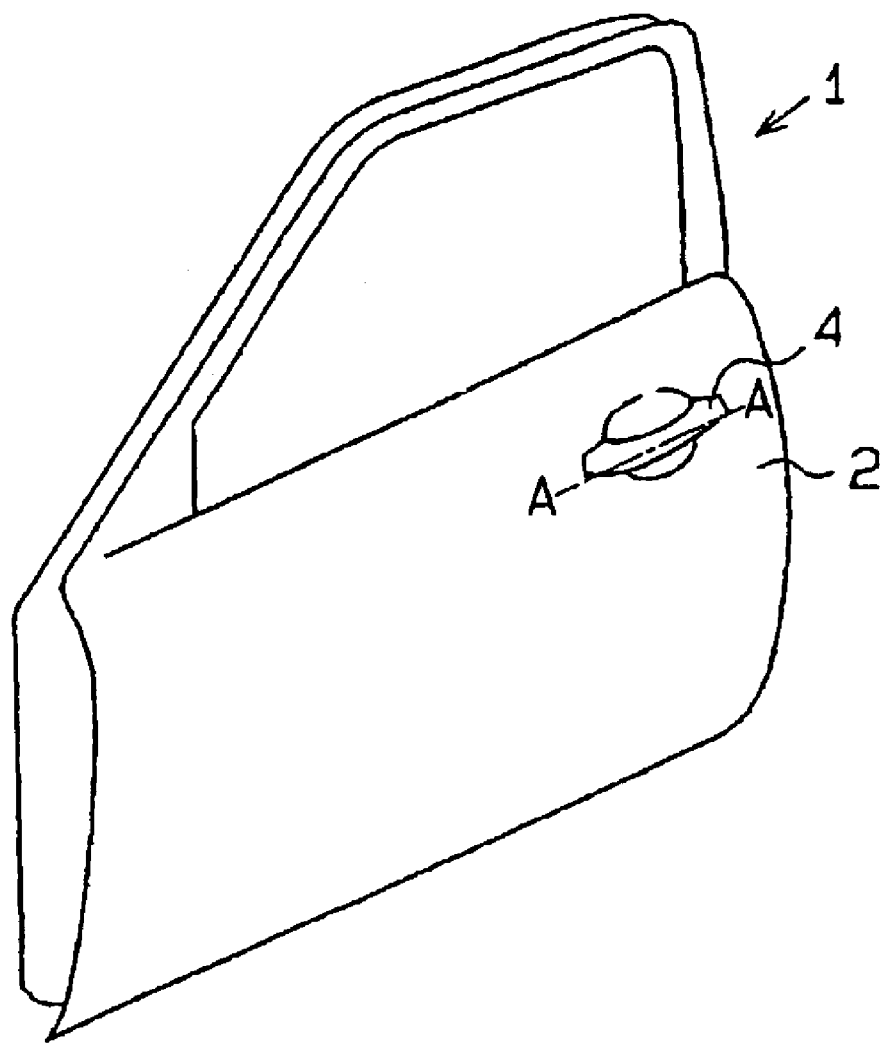
FIG. 1 is a perspective view of a vehicle door.
Figure 2:
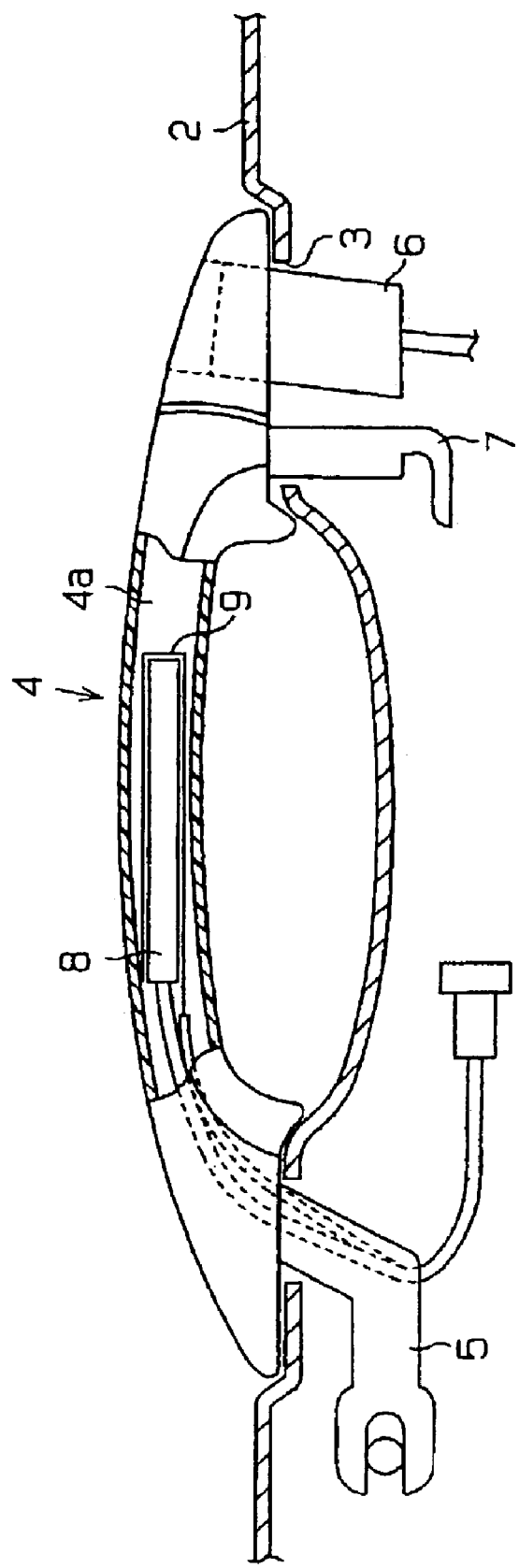
FIG. 2 is a cross sectional view taken along the line A—A of FIG. 1.
Figure 3:
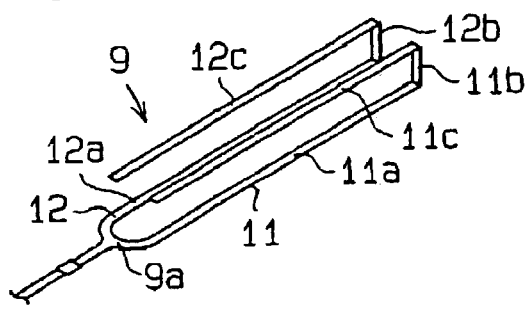
FIG. 3 is a perspective view of a sensor embodiment of the present invention.

A first embodiment of the present invention is explained referring to FIGS. 1–3.

FIG. 1 is a perspective view of a vehicle door. FIG. 2 is a cross sectional view taken along the line A—A of FIG. 1.

As shown in FIGS. 1, 2, a door handle 4 is assembled to a vehicle door 1. Precisely, the door handle 4 is assembled to an opening portion 3 formed in a rear portion of a door outer panel 2 forming the vehicle door 1. The door handle 4 includes an arm 5 in the forward portion and a key cylinder case 6 and a bell crank body 7 in the rearward portion. The bell crank body 7 constitutes a door lock device by cooperating with a link mechanism not shown.

In order to open the vehicle door 1, a user's hand is inserted in a space between the door outer panel 2 and the door handle 4 of the vehicle door 1 to grip the door handle 4. Then the rear portion of the door handle 4 is rotated in an outward direction of the vehicle (counterclockwise direction in FIG. 2) with respect to a tip portion of the arm 5. When the door handle 4 is rotated with respect to the tip portion of the arm 5, the vehicle door 1 becomes in an open state. In order to close the vehicle door 1, the vehicle door 1 is pushed in the direction opposite to that for opening the vehicle door 1.

The door handle 4 is made of synthetic resin. The door handle 4 includes a hollow portion 4a, which is molded with resin under the condition that a transmitting antenna 8 and a sensor electrode 9 as a human body detecting element are accommodated in the hollow portion 4a. That is, the door handle 4 having the hollow portion 4a constitutes a housing in which the transmitting antenna 8 and the sensor electrode 9 are accommodated. The transmitting antenna 8 is provided to communicate with a transmitter carried by the user. The sensor electrode 9 detects an approach of the user by a variation of a capacitance caused by a motion of gripping the door handle 4 (approach of the hand) when the user tries to open the vehicle door 1. That is, the sensor electrode 9 is a sensor for detecting whether the user approaches the door handle 4 or not.

FIG. 3 is a perspective view of the sensor electrode 9 molded in the hollow portion 4a. The sensor electrode 9 is branched from a base portion 9a thereof into a first electrode piece 11 and second electrode piece 12 which each lie in a respective plane. The first electrode piece 11 and the second electrode piece 12 are formed to extend by keeping a predetermined distance therebetween. Further, the first electrode piece 11 and the second electrode piece 12 are then formed to be folded back by keeping a predetermined distance (i.e., in parallel) with the extending portions of the first electrode piece 11 and the second electrode piece 12 respectively. The first electrode piece 11 and the second electrode piece 12 include an outwardly extending portion 11a and 12a respectively extending in a direction away from the base portion 9a. The first electrode piece 11 and the second electrode piece 12 also include a clinch portion 11b and 12b respectively that is bent at right angles to the end portion of the outwardly extending portion 11a and 12a respectively. Further, the first electrode piece 11 and the second electrode piece 12 each include an inwardly extending portion 11c and 12c respectively that is bent at a right angle to the clinch portion 11b and 12b respectively and extends in a direction towards the base portion 9a.

According to the embodiment of the present invention, the lengths of the outwardly extending portions 11a and 12a are the same as those of the inwardly extending portions 11c and 12c. Thus, the end portions of the inwardly extending portions 11c and 12c are positioned to face the base portions of the outwardly extending portions 11a and 12a respectively. Further, in the embodiment of the present invention, the sensor electrode 9 is provided to be molded in the hollow portion 4a so that the outwardly extending portions 11a and 12a are provided at a vehicle-door side and the inwardly extending portions 11c and 12c are provided at an opposite side from the door outer panel. The outwardly extending portions 11a and 12a of the first electrode piece 11 and the second electrode piece 12 respectively detect the user's hand just before the user touches a surface on the vehicle-door side of the door handle 4. In the same way, the inwardly extending portions 11c and 12c of the first electrode piece 11 and the second electrode piece 12 respectively detect the user's hand just before the user touches a surface on the opposite side to the vehicle door of the door handle 4.

The transmitting antenna 8 is provided in a space surrounded by the outwardly extending portions 11a and 12a and the inwardly extending portions 11c and 12c framing four corners of the space thereby. Thus, the transmitting antenna 8 is positioned between the inwardly extending portions 11c and 12c when the door handle 4 is viewed from the opposite side to the vehicle door. The transmitting antenna 8 irradiates radio waves from a space between the inwardly extending portions 11c and 12c. Further, the transmitting antenna 8 is provided to be molded in the hollow portion 4a together with the sensor electrode 9 under the condition of being electrically insulated from the sensor electrode 9.

According to the embodiment of the present invention as described above, the outwardly extending portions 11a and 12a of the first electrode piece 11 and the second electrode piece 12 respectively of the sensor electrode 9 are provided at the vehicle-door side in the door handle 4, and the inwardly extending portions 11c and 12c of the first electrode piece 11 and the second electrode piece 12 respectively, of the sensor electrode 9 are provided at the opposite side to the vehicle door in the hollow portion 4. Thus, the user's hand can be reliably detected in both cases when the user tries to touch the door handle 4 from the vehicle-door side and the side opposite the door outer panel.

In addition, according to the embodiment of the present invention, the sensor electrode 9 is bent in a U-shape to form detecting portions for detecting approach of a human body to the door. Thus, the number of parts of the sensor electrode 9 can be reduced.

Moreover, according to the embodiment of the present invention, the transmitting antenna 8 is provided in the space surrounded by the outwardly extending portions 11a and 12a and the inwardly extending portions 11c and 12c of the sensor electrode 9 framing four corners of the space thereby. The transmitting antenna 8 is positioned between the inwardly extending portions 11c and 12c when the door handle 4 is viewed from the opposite side to the vehicle door. Thus, most of the radio waves transmitted from the transmitting antenna 8 can be emitted outside the door handle 4. As a result, a signal to be transmitted requires low power and thus the transmitting antenna 8 can be smaller in size.

In the above-described embodiment, the sensor electrode 9 is branched from the base portion 9a thereof into the first electrode piece 11 and the second electrode piece 12. The first electrode piece 11 and the second electrode piece 12 each include the outwardly extending portion 11a and 12a extending in the direction away from the base portion 9a, and the inwardly extending portion 11c and 12c folded back and extending in the direction towards the base portion 9a. The outwardly extending portions 11a and 12a detect the approach of the user to the surface on the vehicle-door side of the door handle 4 and the inwardly extending portions 11c and 12c detect the approach of the user to the surface on the opposite side from the door outer panel. However, the outwardly extending portions 11a and 12a may be provided at the opposite side to the vehicle door in the door handle 4 while the inwardly extending portions 11c and 12c may be provided at the vehicle-door side in the door handle 4.

In this case, the inwardly extending portions 11c and 12c detect the approach of the user to the surface on the vehicle-door side of the door handle 4 and the outwardly extending portions 11a and 12a detect the approach of the user to the surface on the opposite side from the outer door panel.

Although in the embodiment of the present invention, the transmitting antenna 8 is provided in the space surrounded by the first electrode piece 11 and the second electrode piece 12, the location of the transmitting antenna 8 is not limited to being provided in that space.

Figure 4:
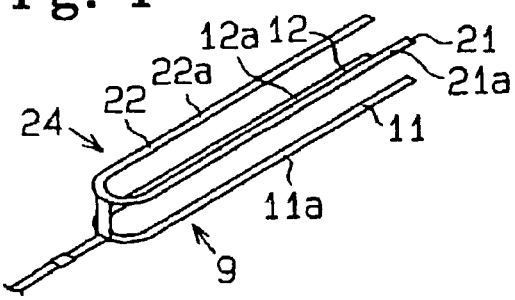
FIG. 4 is a perspective view of a sensor embodiment of the present invention.

A second embodiment of the present invention is explained referring to FIG. 4. As shown in FIG. 4, the sensor electrode 9 is branched into the first electrode piece 11 and the second electrode piece 12, which each consist of only the outwardly extending portion 11a and 12a respectively. In addition, another sensor electrode 24 includes a third electrode piece 21 and a fourth electrode piece 22, which each consist of only an outwardly extending portion 21a and 22a respectively having the same shape as the outwardly extending portion 11a and 12a respectively. The third electrode piece 21 and the fourth electrode piece 22 of the sensor electrode 24, and the first electrode piece 11 and the second electrode piece 12 are electrically connected so as to face to each other while keeping a predetermined distance therebetween.

In this case also, the first electrode piece 11 and the second electrode piece 12 detect the approach of the user to the surface on the vehicle-door side of the door handle 4, and the third electrode piece 21 and the fourth electrode piece 22 detect the approach of the user to the surface on the opposite side from the door outer panel. Further, most of the radio waves transmitted from the transmitting antenna 8 can be emitted outside the door handle 4 by providing the transmitting antenna 8 in a space between the two sensor electrodes 9, 24.

Figure 5:
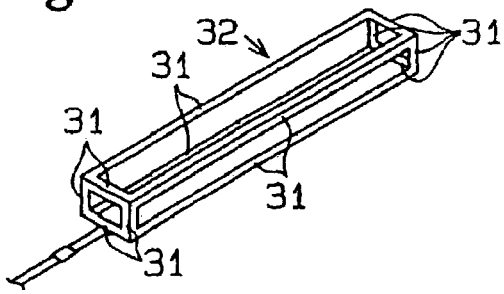
FIG. 5 is a perspective view of a sensor embodiment of the present invention.

A third embodiment of the present invention is explained referring to FIG. 5. As shown in FIG. 5, a sensor electrode 32 formed by twelve electrode pieces 31 is employed. The twelve electrode pieces 31 are interconnected so as to form a single rectangular shape with each electrode piece constituting one edge thereof. Then the approach of the user to the surface on the vehicle door side and the surface on the opposite side from the door outer panel can be detected. In addition, the twelve electrode pieces 31 of the sensor electrode 32 in the single rectangular shape also detect whether the user approaches to the surface on the upper side and the lower side of the door handle 4. Further, most of the radio waves transmitted from the transmitting antenna 8 can be emitted outside the door handle 4 by providing the transmitting antenna 8 in a space surrounded by each piece of the twelve electrode pieces 31.

Figure 6:
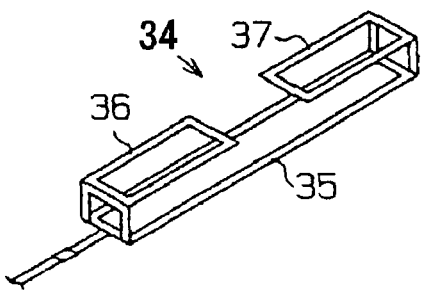
FIG. 6 is a perspective view of a sensor embodiment of the present invention.

A fourth embodiment of the present invention is explained referring to FIG. 6. As shown in FIG. 6, a sensor electrode 34 formed by electrode pieces 35, 36, and 37 is employed. The sensor electrode 35 obtains a rectangular-frame shape. The sensor electrodes 36 and 37 each having another rectangular-frame shape shorter than that of the electrode piece 35 in a longitudinal direction are electrically connected to opposite ends of the sensor electrode 35 respectively so as to face each other while keeping a predetermined distance therebetween. Then the approach of the user to the surface on the vehicle-door side and the surface on the opposite side from the door outer panel can be detected. In addition, most of the radio waves transmitted from the transmitting antenna 8 can be emitted outside the door handle 4 by providing the transmitting antenna 8 in a space between the electrode pieces 35, 36, and 37.

Figure 7:
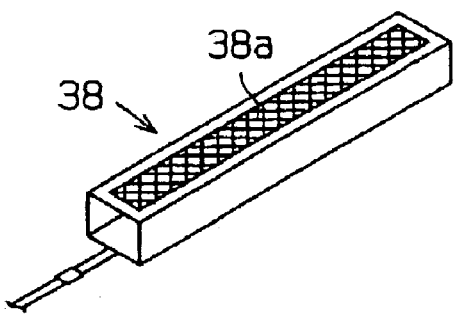
FIG. 7 is a perspective view of a sensor embodiment of the present invention.

A fifth embodiment of the present invention is explained referring to FIG. 7. As shown in FIG. 7, a sensor electrode 38 having a rectangular shape in cross section with a hollow portion therein is employed. It can be reliably detected whether the user approaches the surface on the vehicle-door side and the surface on the opposite side from the door outer panel. When the transmitting antenna 8 is provided inside of the sensor electrode 38 having the rectangular shape in cross section with the hollow portion therein, a surface facing outside the door handle 4 may be meshed to form a radio wave emission surface 38a as shown in FIG. 7. The radio wave emission surface 38a can also be provided with a great number of through-holes so that the radio waves transmitted from the transmitting antenna 8 are emitted outside the vehicle door 1. Further, the radio wave transmission surface 38a is not limited to being formed on a specific surface but can be formed on any surfaces of the sensor electrode 38.

Figure 8:
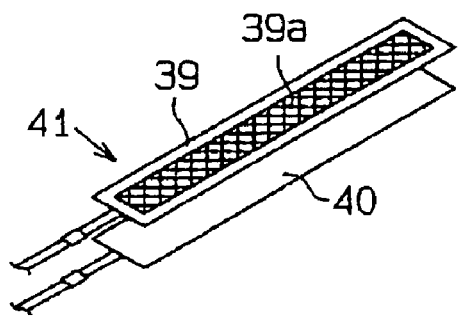
FIG. 8 is a perspective view of a sensor electrode according to a sixth embodiment of the present invention.

A sixth embodiment of the present invention is explained referring to FIG. 8. As shown in FIG. 8, a sensor electrode 41 including a pair of electrode pieces 39 and 40 of plate shape is employed. The electrode pieces 39 and 40 are provided in parallel while keeping a predetermined distance therebetween. It can be reliably detected whether the user approaches the surface on the vehicle-door side and the surface on the opposite side from the door outer panel by providing the electrode piece 39 on the opposite side to the vehicle door and providing the electrode piece 40 on the vehicle-door side in the door handle 4. When the transmitting antenna 8 is provided in a space between the electrode pieces 39 and 40, a surface provided at the opposite side to the vehicle door can be meshed to form a radio wave emission surface 39a as shown in FIG. 8. Further, the radio wave emission surface 39a can also be provided with a great number of through-holes so that the radio waves transmitted from the transmitting antenna 8 are emitted outside the vehicle door 1.

Figure 9:
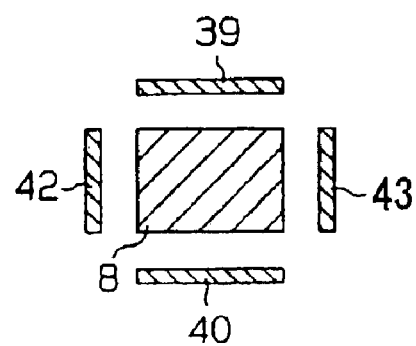
FIG. 9 is a perspective view of a sensor electrode according to a seventh embodiment of the present invention.

A seventh embodiment of the present invention is explained referring to FIG. 9. As shown in FIG. 9, the electrode pieces 39 and 40 each having a plate shape are provided at the opposite side of the vehicle door and the vehicle-door side relative to the transmitting antenna 8 in the door handle 4 respectively. In addition, the electrode pieces 42 and 43 each having a plate shape are provided at the upper side and the lower side relative to the transmitting antenna 8 respectively. In this case, the approach of the user to the surface on the vehicle-door side, the surface on the opposite side from the door outer panel, the surface on the upper side, and the surface on the lower side relative to the transmitting antenna 8 of the door handle 4 can be detected.

Although in the above-described embodiments, the housing where a human body detecting device is accommodated is embodied by the door handle for the vehicle, the housing may be embodied by other parts.

According to the above-described embodiments, the human body detecting device can provide a high sensitivity for detecting the approach of the human body.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A human body detecting device for detecting an approach of a human body, comprising:
a sensor electrode provided in a housing which is a door handle of a vehicle, the sensor electrode comprising a first detecting portion and a second detecting portion for detecting the approach of the human body to the housing;
the sensor electrode being bent in U-shape so that the first detecting portion includes an outwardly extending portion extending along one side wall of the housing and the second detecting portion includes an inwardly extending portion extending along the other side wall of the housing;
a transmitting antenna provided in a space between the outwardly extending portion and the inwardly extending portion to communicate with a transmitters
the outwardly extending portion being provided at a vehicle-door side of the housing and the inwardly extending portion being provided at a side of the housing opposite the vehicle-door side of the housing;
the inwardly extending portion comprising two inwardly extending portions which extend so that a space exists between the two inwardly extending portions, with a radio wave emitted by the transmitting antenna being emitted to outside the door handle through the space between the two inwardly extending portions.

2. A human body detecting device according to claim 1, wherein;
the sensor electrode is branched from a base portion thereof into a first electrode piece and a second electrode piece, and wherein the first electrode piece and the second electrode piece are bent in the same direction in a U-shape whereby the outwardly extending portion constitutes a part of the first electrode piece and the two inwardly extending portions constitute a part of the first electrode piece and a part of the second electrode piece.

3. A human body detecting device according to claim 1, wherein;
the sensor electrode includes a first electrode piece having a rectangular-frame shape, and a second electrode piece and a third electrode piece each having another rectangular-frame shape shorter than that of the first electrode piece in a longitudinal direction, wherein the second electrode piece and the third electrode piece are electrically connected to opposite ends of the first electrode piece respectively so as to face to each other with a predetermined distance therebetween, the outwardly extending portion constituting at least a part of the first electrode piece and the two inwardly extending portions constituting at least a part of one of the second and third electrode pieces.

4. A human body detecting device for detecting an approach of a human body, comprising:
a sensor electrode provided in a housing which is a door handle for a vehicle and comprising a first detecting portion and a second detecting portion for detecting the approach of the human body to the housing;
the first detecting portion comprising a first electrode piece extending along one side wall of the housing and the second detecting portion comprising a second electrode piece extending along the other side wall of the housing;
a transmitting antenna provided in a space between the first electrode piece and the second electrode piece;
the first electrode piece being provided at a vehicle-door side and the second electrode piece being provided at an opposite side to the vehicle-door;
the first electrode piece and the second electrode piece being parallel to one another with a predetermined distance between the first and second electrode pieces; and
the second electrode piece comprising a radio wave emission surface so that a radio wave transmitted from the transmitting antenna is emitted outside the vehicle-door through the radio wave emission surface.

5. A human body detecting device according to claim 4, wherein;
the sensor electrode has a rectangular shape, and a space for radio wave transmission is formed on a surface provided at the opposite side to the vehicle door of the sensor electrode.

6. A human body detecting device according to claim 4, wherein; the sensor electrode includes the first electrode piece and the second electrode piece being plate shaped.

7. A human body detecting device according to claim 6, wherein;
a third electrode piece and a fourth electrode piece of a plate shape are provided at an upper side and a lower side relative to the transmitting antenna in the door handle.

8. A human body detecting device according to claim 4, wherein the radio wave emission surface is a meshed surface from which the radio wave from the transmitting antenna is emitted.

9. A human body detecting device for detecting an approach of a human body, comprising:
a sensor electrode provided in a housing which is a door handle for a vehicle and having a first detecting portion and a second detecting portion for detecting the approach of the human body to the housing, the first detecting portion extending along one side wall of the housing and the second detecting portion extending along the other side wall of the housing, the first detecting portion being provided at a vehicle-door side and the second detecting portion being provided at an opposite side to the vehicle-door,
the first detecting portion comprising a first electrode piece and a second electrode piece, the first electrode piece and the second electrode piece extending so that a predetermined distance exists between the first and second electrode pieces;
the second detecting portion comprising a third electrode piece and a fourth electrode piece, the third electrode piece and the fourth electrode piece extending so that a space exists between the third and fourth electrode pieces;
a transmitting antenna provided in a space between the first electrode piece, the second electrode piece, the third electrode piece and the fourth electrode piece, with a radio wave emitted by the transmitting antenna being emitted to outside the door handle through the space between the third electrode piece and the fourth electrode piece.

10. A human body detecting device according to claim 9, wherein;
the third electrode piece and the fourth electrode piece are electrically connected to the first electrode piece and the second electrode piece so as to face to each other with a predetermined distance therebetween.

11. A human body detecting device according to claim 9, wherein;
the sensor electrode includes twelve electrode pieces interconnected so as to form a single rectangular shape in which each edge of the rectangular shape is constituted by one of the electrode pieces and a transmitting antenna is provided in a space surrounded by the twelve electrode pieces.

* * * * *